United States Patent
Yu et al.

(10) Patent No.: US 8,405,222 B2
(45) Date of Patent: Mar. 26, 2013

(54) INTEGRATED CIRCUIT SYSTEM WITH VIA AND METHOD OF MANUFACTURE THEREOF

(75) Inventors: Hong Yu, Singapore (SG); Huang Liu, Singapore (SG); Feng Zhao, Singapore (SG); Meisheng Zhou, Singapore (SG); Liang-Choo Hsia, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 12/825,266

(22) Filed: Jun. 28, 2010

(65) Prior Publication Data

US 2011/0316166 A1 Dec. 29, 2011

(51) Int. Cl.
*H01L 21/00* (2006.01)
(52) U.S. Cl. .......................................... 257/774; 438/637
(58) Field of Classification Search .......... 257/773–776; 438/637
See application file for complete search history.

(56) References Cited

U.S. PATENT DOCUMENTS

| | | | |
|---|---|---|---|
| 7,626,257 B2 * | 12/2009 | Knorr | 257/698 |
| 7,633,165 B2 | 12/2009 | Hsu et al. | |
| 7,968,460 B2 * | 6/2011 | Kirby et al. | 438/667 |
| 2009/0160058 A1 | 6/2009 | Kuo et al. | |
| 2010/0038800 A1 | 2/2010 | Yoon et al. | |

OTHER PUBLICATIONS

U.S. Appl. No. 12/470,028, filed May 21, 2009, Yelehanka et al.

\* cited by examiner

*Primary Examiner* — Richard A. Booth
(74) *Attorney, Agent, or Firm* — Ishimaru & Associates LLP

(57) ABSTRACT

A method of manufacture of an integrated circuit system includes: forming an etch stop layer over a bulk substrate; forming a buffer layer on the etch stop layer; forming a hard mask on the buffer layer; forming a through silicon via through the etch stop layer with the hard mask detected and the buffer layer removed with a low down force; and forming a passivation layer on the through silicon via and the etch stop layer.

20 Claims, 7 Drawing Sheets

INTEGRATED CIRCUIT SYSTEM WITH VIA AND METHOD OF MANUFACTURE THEREOF

TECHNICAL FIELD

The present invention relates generally to an integrated circuit system, and more particularly to a system for an integrated circuit system with via.

BACKGROUND ART

Increased miniaturization of components, greater packaging density of integrated circuits ("ICs"), higher performance, and lower cost are ongoing goals of the computer and communication industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package on package (POP). POP designs face reliability challenges and higher cost.

Thus, a need still remains for an integrated circuit system including providing low cost manufacturing, increased integration, and improved reliability. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit system including: forming an etch stop layer over a bulk substrate; forming a buffer layer on the etch stop layer; forming a hard mask on the buffer layer; forming a through silicon via through the etch stop layer with the hard mask detected and the buffer layer removed with a low down force; and forming a passivation layer on the through silicon via and the etch stop layer.

The present invention provides an integrated circuit system, including: a bulk substrate; an etch stop layer over the bulk substrate; a through silicon via through the etch stop layer, the through silicon via having characteristics of being formed with a hard mask detected and a buffer layer removed; and a passivation layer on the through silicon via and the etch stop layer.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
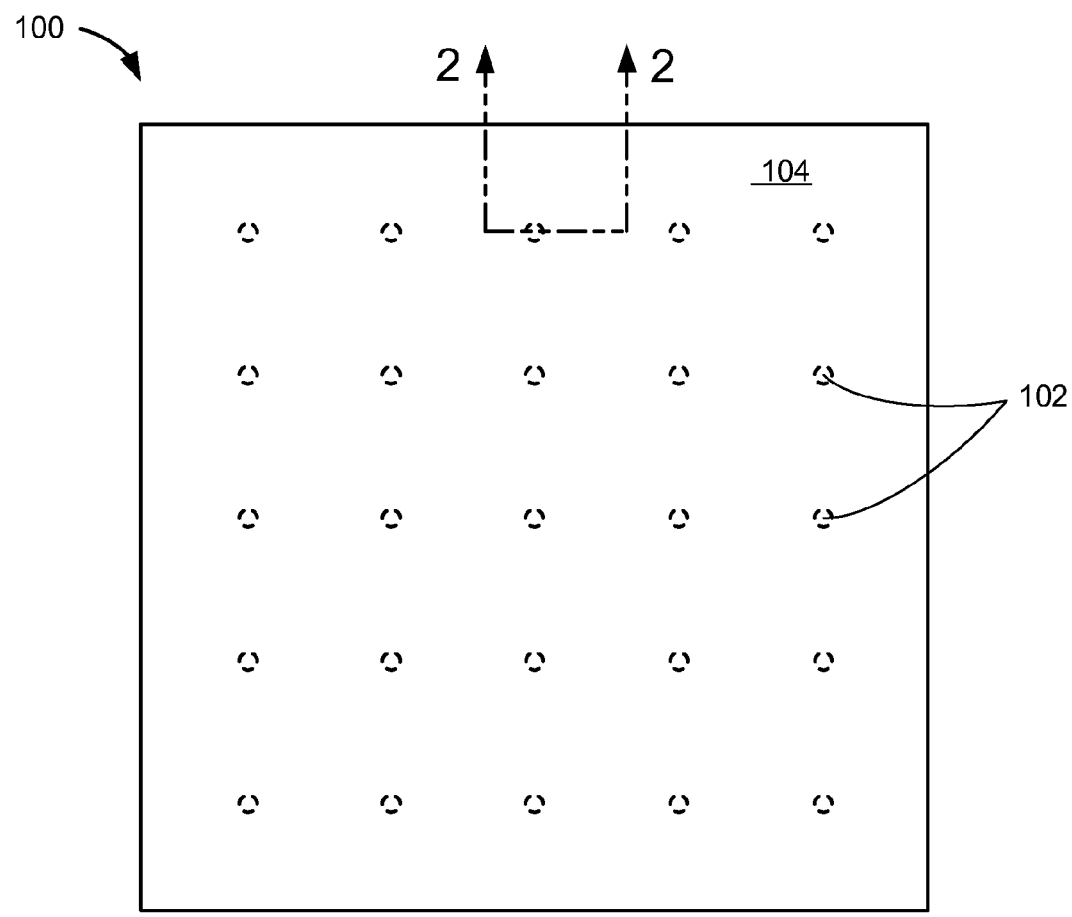
FIG. 1 is a top view of an integrated circuit system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit system 100 in an embodiment of the present invention. The integrated circuit system 100 can include a through silicon via 102, more specifically a channel of a conductive material including copper (Cu), a metal, or a metallic alloy. A passivation layer 104, more specifically a dielectric layer or a protection layer, can be formed over the through silicon via 102.

For illustrative purposes, the through silicon via 102, depicted by a dashed circle, is shown under the passivation layer 104, although the through silicon via 102 can be formed in a different configuration. For example, the through silicon via 102 can be exposed from the passivation layer 104 to provide connectivity between the integrated circuit system 100 and external integrated circuit systems (not shown) stacked thereover. Also for example, the through silicon via 102 can be formed in different stages of manufacturing the integrated circuit system 100 such that the through silicon via 102 can be form at different layers of the integrated circuit system 100.

Also for illustrative purposes, the through silicon via 102 is shown in an area array, although the through silicon via 102 can be formed in any configuration. For example, the through silicon via 102 can be formed in a peripheral array or an array that is not uniformly distributed.

Figure 2:
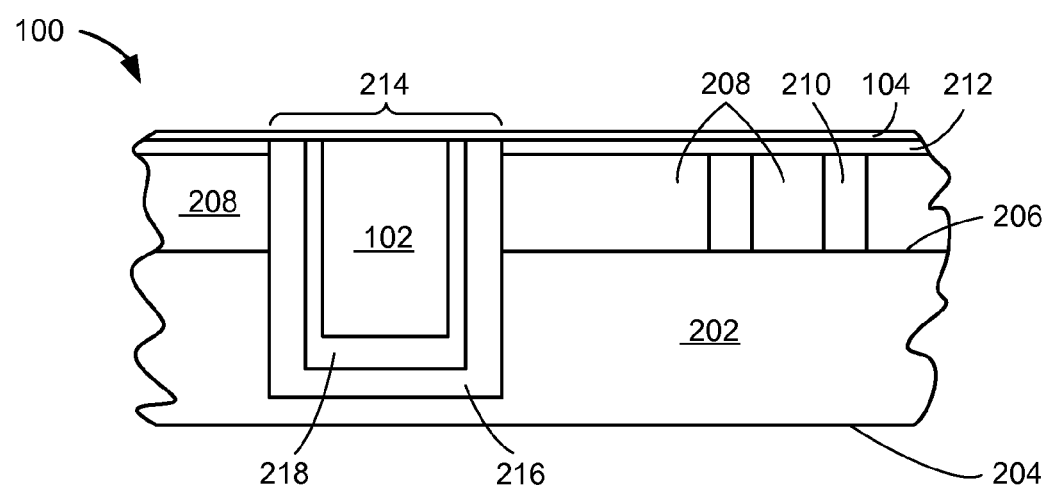
FIG. 2 is a cross-sectional view of a portion of the integrated circuit system along a section line 2-2 of FIG. 1.

Referring now to FIG. 2, therein is shown a cross-sectional view of a portion of the integrated circuit system 100 along a section line 2-2 of FIG. 1. The integrated circuit system 100 can include a bulk substrate 202, more specifically a chip or die bulk substrate, a semiconductor substrate, or a semiconductor device mounting support.

The bulk substrate 202 can have a non-active side 204 and an active side 206 opposite to the non-active side 204. The active side 206 can have active circuitry (not shown) fabricated thereon. A device (not shown), such as a transistor or a circuit network, can be formed along the active side 206.

An interlayer dielectric 208, more specifically an oxide or an insulator, can be formed directly on the bulk substrate 202 and along the active side 206. A contact 210, more specifically a plug or a conductor, can be formed through or in the interlayer dielectric 208 and along the active side 206.

An etch stop layer 212, more specifically an insulator or a dielectric, can be formed over the interlayer dielectric 208 and the contact 210. For example, the etch stop layer 212 can be a low-k dielectric film.

A recess 214 can be formed through the etch stop layer 212 and the interlayer dielectric 208. The recess 214 can be formed in a portion of the bulk substrate 202.

An insulator 216, more specifically an oxide, an isolation layer, or a dielectric liner, can be formed within the recess 214 and through the etch stop layer 212, the interlayer dielectric 208, and a portion of the bulk substrate 202. A liner 218, more specifically a diffusion barrier, can be formed within the recess 214 and over the insulator 216.

The through silicon via 102 can be formed within the recess 214 and over the liner 218. The insulator 216 can minimize or eliminate current flow between the bulk substrate 202 and the through silicon via 102. The liner 218 can inhibit diffusion of the conductive material that is used to form the through silicon via 102 into the interlayer dielectric 208.

A top surface of the etch stop layer 212 can be coplanar with top surfaces of portions of the insulator 216, the liner 218, and the through silicon via 102. The passivation layer 104 can be formed over or directly on the top surfaces of the etch stop layer 212, the insulator 216, the liner 218, and the through silicon via 102.

Figure 3:
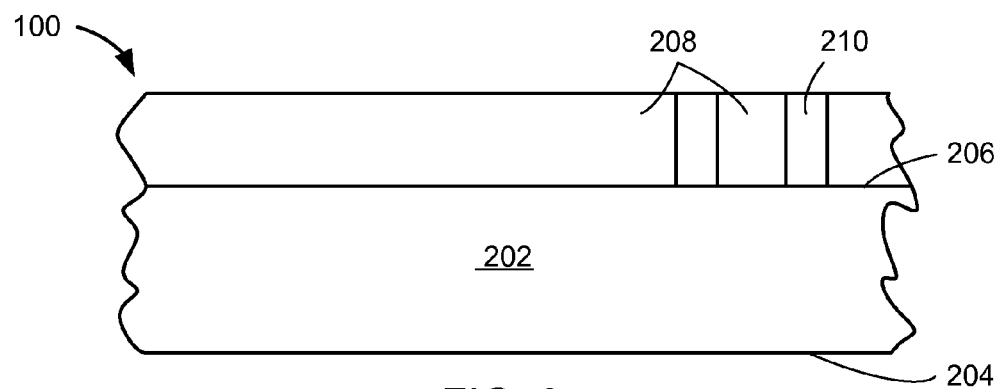
FIG. 3 is the structure of FIG. 2 in a dielectric forming phase of manufacture.

Referring now to FIG. 3, therein is shown the structure of FIG. 2 in a dielectric forming phase of manufacture. The integrated circuit system 100 can include the bulk substrate 202. For example, the bulk substrate 202 can include silicon (Si), gallium arsenide (GaAs), or indium phosphide (InP).

The bulk substrate 202 can have the non-active side 204 and the active side 206. The interlayer dielectric 208 can be formed along the active side 206. For example, the interlayer dielectric 208 can be a high density plasma (HDP) oxide, a silicon dioxide ($SiO_2$), a silicate glass, a dielectric with a low dielectric constant (low-k), or an insulator.

The contact 210 can be formed through the interlayer dielectric 208 and along the active side 206, to the bulk substrate 202, or a combination thereof. The cross-sectional view depicts a structure of the contact 210 after a planarization process. With the planarization process, an excess portion (not shown) of the contact 210 above the interlayer dielectric 208 can be removed and a top surface of the contact 210 can be planar with the interlayer dielectric 208.

For example, the planarization process can include a chemical mechanical planarization (CMP) process or any other removal process. Also for example, the contact 210 can be formed with a conductive material including tungsten (W), copper (Cu), aluminum (Al), magnesium (Mg), any other metal, or a metallic alloy.

Figure 4:
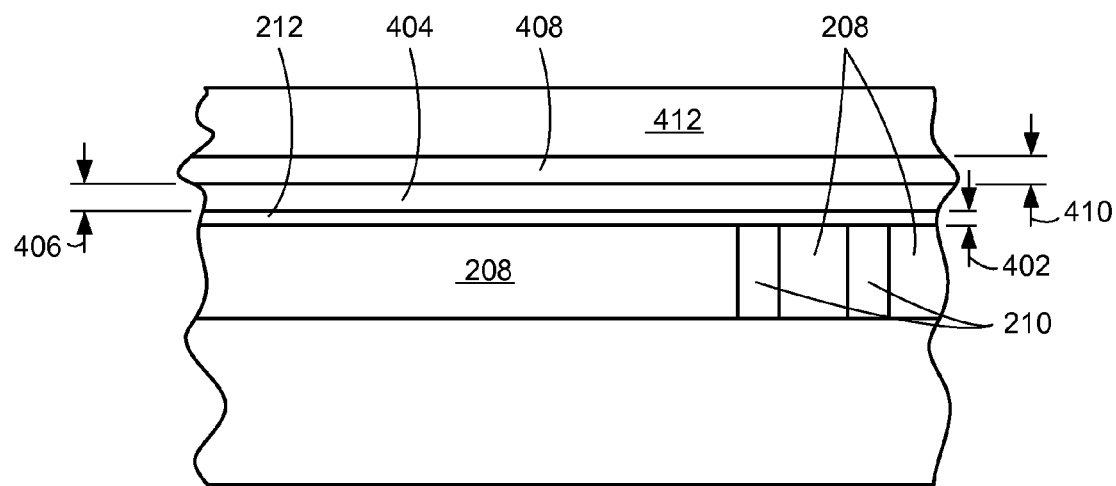
FIG. 4 is the structure of FIG. 3 in a resist attaching phase.

Referring now to FIG. 4, therein is shown the structure of FIG. 3 in a resist attaching phase. The etch stop layer 212 can be deposited over the interlayer dielectric 208 and the contact 210.

For example, the etch stop layer 212 can include silicon nitride (SiN), silicon carbide (SiC), silicon carbon nitride (SiCN), or low-k Nblock (SiCNH). The etch stop layer 212 can have an etch stop layer thickness 402 in an approximate range of 100 angstroms to 1000 angstroms as an example range of thickness.

A buffer layer 404, more specifically an oxide buffer layer or an insulator, can be formed on the etch stop layer 212. For example, the buffer layer 404 can include tetraethyl orthosilicate (TEOS), un-doped silicate glass (USG), thermal oxide, or high density plasma (HDP). Also for example, the buffer layer 404 can have a buffer layer thickness 406 in an approximate range of 300 angstroms to 1500 angstroms.

A hard mask 408, more specifically a metal hard mask, can be formed on the buffer layer 404. For example, the hard mask 408 can include titanium nitride (TiN), tantalum nitride (TaN), or ruthenium (Ru).

For example, the hard mask 408 can have a hard mask thickness 410 in an approximate range of 100 angstroms to 800 angstroms. The hard mask 408 can be formed by a deposition technique, such as physical vapor deposition (PVD), chemical vapor deposition (CVD), sputtering, laser, atomic layer deposition (ALD), or electron beam evaporation.

A resist layer 412, more specifically a photo resist, can be formed on the hard mask 408. For example, the resist layer 412 can be a light sensitive material that is resistant to an etching treatment. As an example, the resist attaching phase can include intermediate polymer stamp (IPS), lithography, or any imprint processes.

Figure 5:
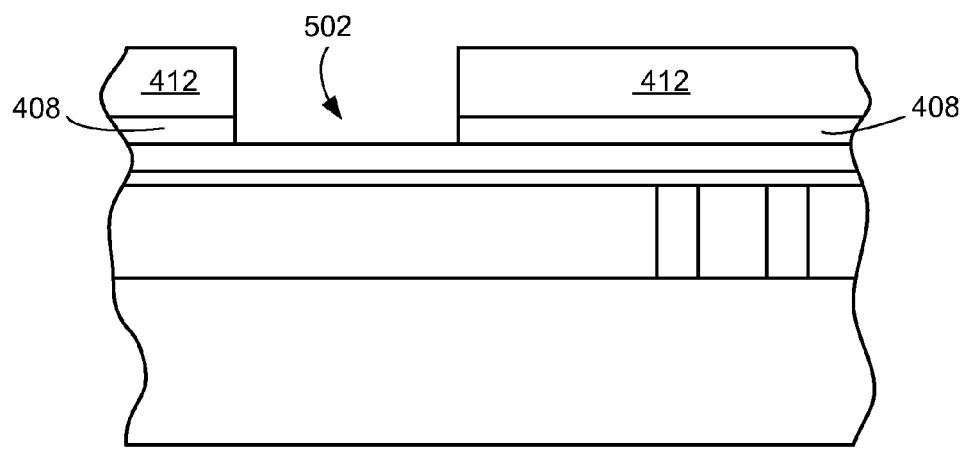
FIG. 5 is the structure of FIG. 4 in a mask patterning phase.

Referring now to FIG. 5, therein is shown the structure of FIG. 4 in a mask patterning phase. The resist layer 412 and the hard mask 408 can be partially removed. For example, the resist layer 412 and the hard mask 408 can be removed by a reactive ion etching (RIE) process or other anisotropic etching processes. With the resist layer 412 serving as an etch mask, the hard mask 408 can be patterned to have a hole 502 in the hard mask 408.

Figure 6A:
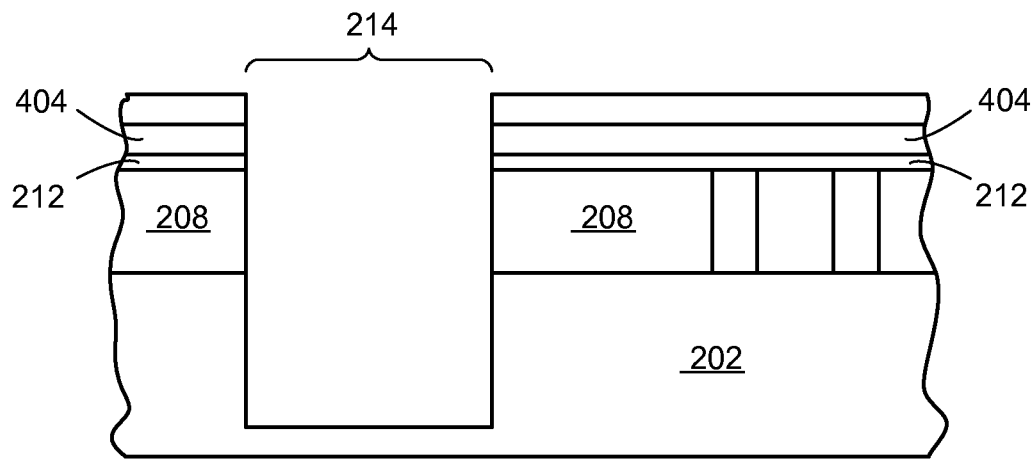
FIG. 6(A) is the structure of FIG. 5 in a buffer exposing phase of a manufacture process.

Referring now to FIG. 6(A), therein is shown the structure of FIG. 5 in a buffer exposing phase of a manufacture process. A remaining portion of the resist layer 412 of FIG. 4 can continue to serve as an etch mask to remove portions of the buffer layer 404, the etch stop layer 212, the interlayer dielectric 208, and the bulk substrate 202 to form the recess 214. After that, the remaining portion of the resist layer 412 can be stripped.

Figure 6B:
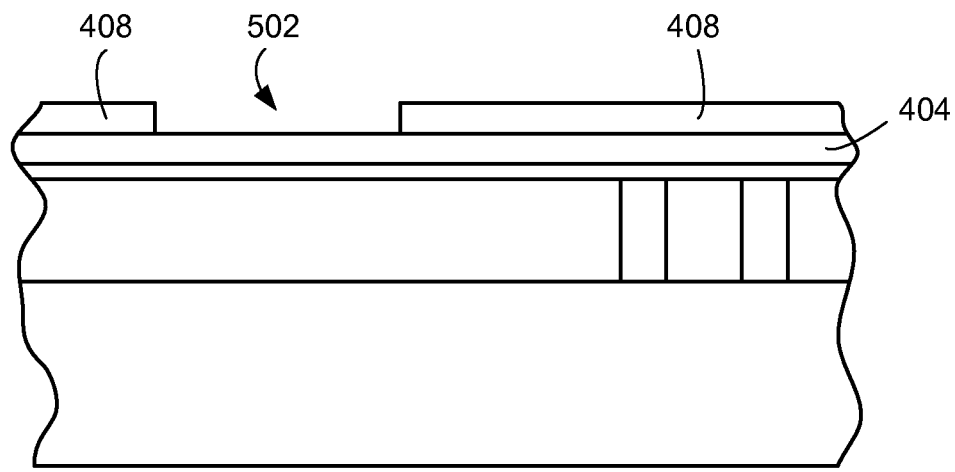
FIG. 6(B) is the structure of FIG. 5 in a buffer exposing phase of another manufacture process.

Referring now to FIG. 6(B), therein is shown the structure of FIG. 5 in a buffer exposing phase of another manufacture process. The resist layer 412 of FIG. 4 that is partially removed can be stripped after the hard mask 408 is patterned in the mask patterning phase. A portion of the buffer layer 404 can be exposed in the hole 502.

Figure 7:
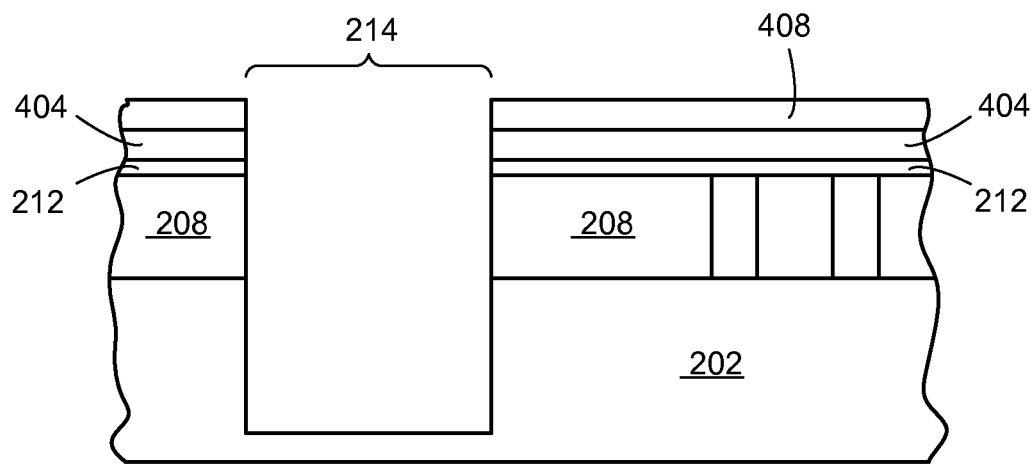
FIG. 7 is the structure of FIG. 6(B) in a recess forming phase.

Referring now to FIG. 7, therein is shown the structure of FIG. 6(B) in a recess forming phase. The hard mask 408 can serve as another etch mask to remove portions of the buffer layer 404, the etch stop layer 212, the interlayer dielectric 208, and the bulk substrate 202.

The portions of the buffer layer 404, the etch stop layer 212, the interlayer dielectric 208, and the bulk substrate 202 can be removed with a reactive ion etching (RIE) process or other anisotropic etching processes. The portions can be removed to form the recess 214 through the hard mask 408.

The recess 214 can be through the buffer layer 404, the etch stop layer 212, and the interlayer dielectric 208. The recess 214 can be formed in a portion of the bulk substrate 202. The recess forming phase can include a reactive ion etching (RIE) cleaning process after the recess 214 is formed.

Figure 8:
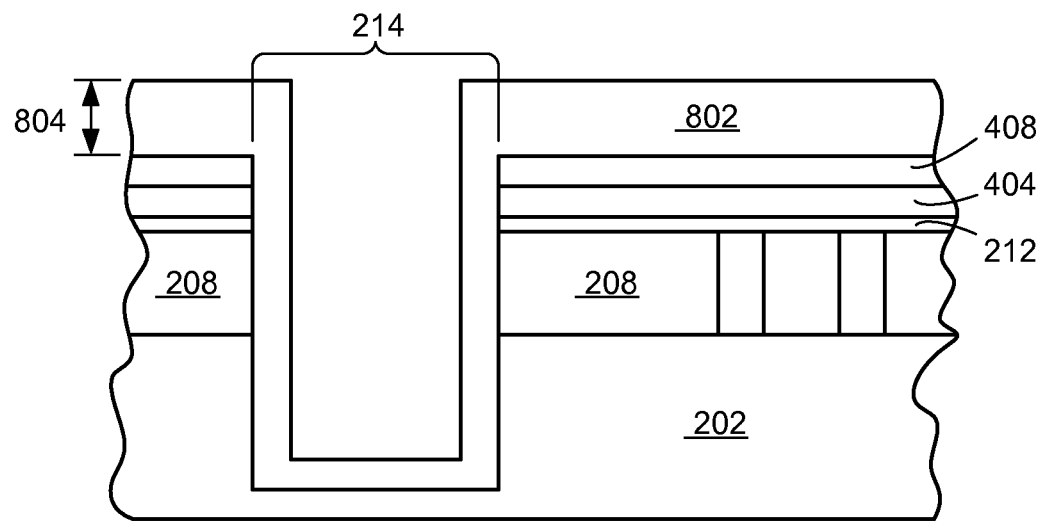
FIG. 8 is the structure of FIG. 6(A) or FIG. 7 in an insulation forming phase.

Referring now to FIG. 8, therein is shown the structure of FIG. 6(A) or FIG. 7 in an insulation forming phase. An insulation layer 802, more specifically an oxide, an isolation layer, or a dielectric liner, can be formed over the hard mask 408.

The insulation layer 802 can be deposited on the hard mask 408. The insulation layer 802 can be deposited over portions of the buffer layer 404, the etch stop layer 212, the interlayer dielectric 208, and the bulk substrate 202 that surround the recess 214.

For example, the insulation layer 802 can include un-doped silicate glass (USG), tetraethyl orthosilicate (TEOS), thermal oxide, or high density plasma (HDP). As an example, the insulation layer 802 can have an insulation layer thickness 804 in an approximate range of 500 angstroms to 2000 angstroms.

Figure 9:
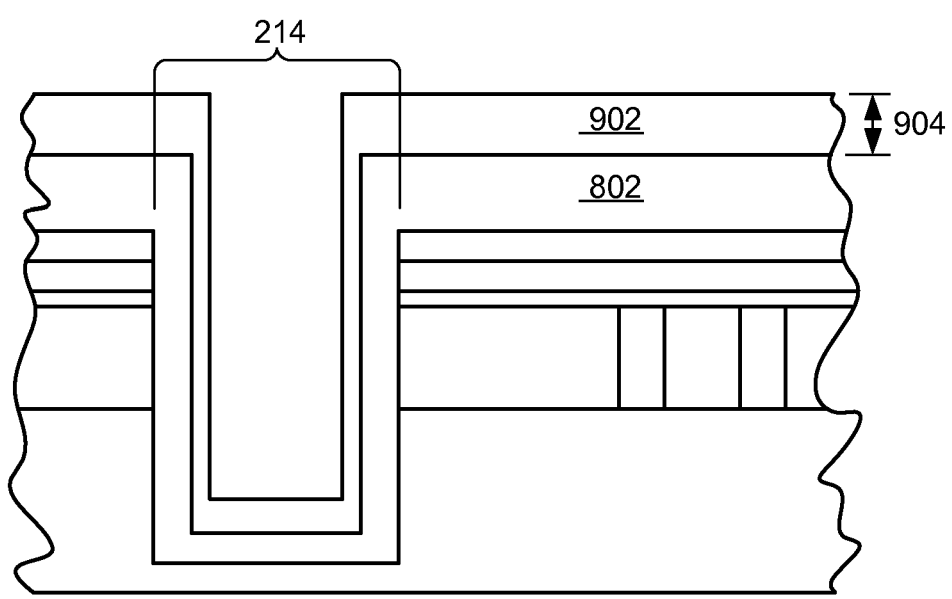
FIG. 9 is the structure of FIG. 8 in a barrier forming phase.

Referring now to FIG. 9, therein is shown the structure of FIG. 8 in a barrier forming phase. A barrier layer 902, more specifically a diffusion barrier, can be formed over the insulation layer 802. For example, the barrier layer 902 can include Tantalum (Ta), tantalum nitride (TaN), ruthenium (Ru), Titanium (Ti), or titanium nitride (TiN).

The barrier layer 902 can be deposited on a portion of the insulation layer 802 that is formed within the recess 214. As an example, the barrier layer 902 can have a barrier layer thickness 904 in an approximate range of 500 angstroms to 1500 angstroms.

Figure 10:
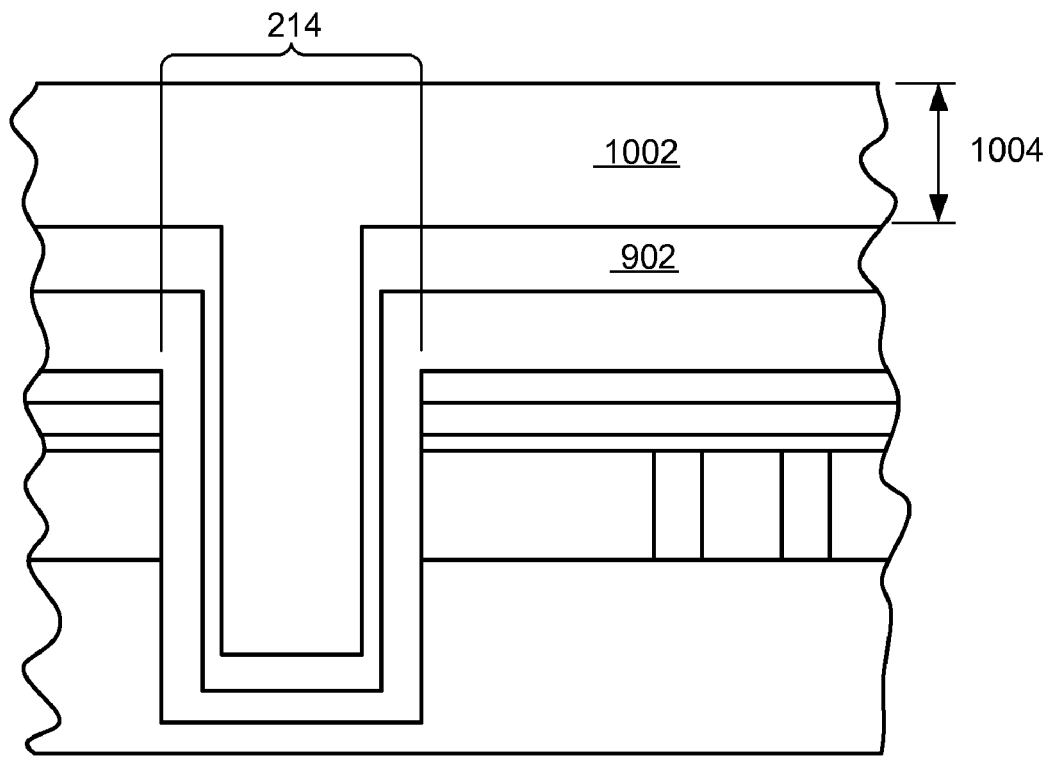
FIG. 10 is the structure of FIG. 9 in a conductor plating phase.

Referring now to FIG. 10, therein is shown the structure of FIG. 9 in a conductor plating phase. A conductive layer 1002 can be deposited on the barrier layer 902. For example, the conductive layer 1002 can include copper (Cu), a metal, or a metallic alloy.

The conductive layer 1002 can be formed on or over a portion of the barrier layer 902 that is formed within the recess 214. As an example, the conductive layer 1002 can have a conductive layer thickness 1004 in an approximate range of 5 micrometers to 10 micrometers.

For illustrative purposes, the conductive layer 1002 is shown on the barrier layer 902, although an additional layer (not shown) can be formed. For example, the additional layer can be a seed layer that can be formed on the barrier layer 902 followed by a process of plating the conductive layer 1002 on the seed layer.

The conductive layer 1002 can be formed by sputtering, electroplating, chemical vapor deposition (CVD), physical vapor deposition (PVD), or a masking and metal deposition technique. The conductor plating phase can include an annealing process to improve the properties of the conductive layer 1002 prior to subsequent processes.

Figure 11:
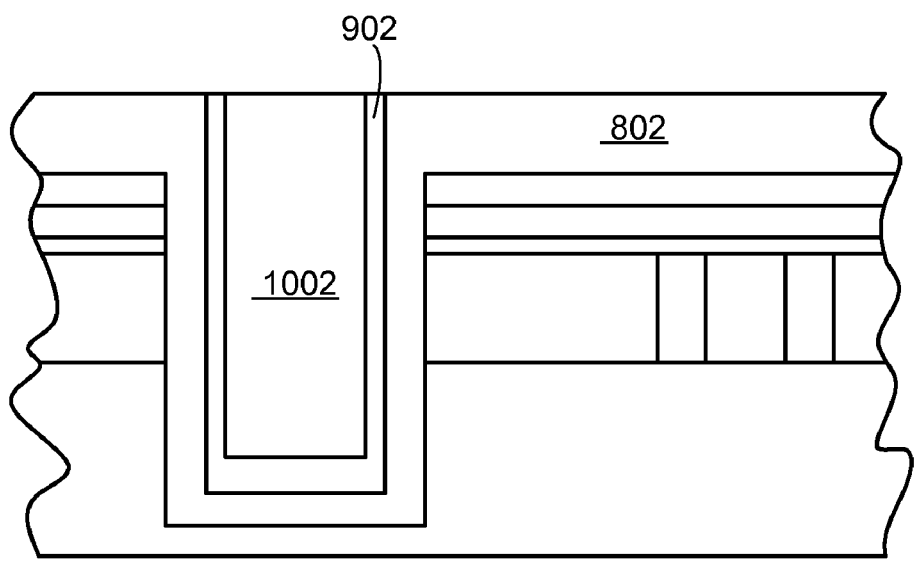
FIG. 11 is the structure of FIG. 10 in a conductor and barrier planarizing phase.

Referring now to FIG. 11, therein is shown the structure of FIG. 10 in a conductor and barrier planarizing phase. The conductive layer 1002 and the barrier layer 902 of FIG. 10 can be partially removed with the planarization process including a chemical mechanical planarization (CMP) process or any other removal process. For example, the chemical mechanical planarization process can use chemical processes with corrosive actions and mechanical processes with abrasive materials.

Portions of the conductive layer 1002 and the barrier layer 902 that are over the insulation layer 802 can be removed. The portions can be removed with a high down force or pressure, more specifically a force larger than approximately 2.5 pounds per square inch (psi), to achieve a high removal rate, more specifically a removal rate higher than approximately 1 micrometer per minute (um/min). With the portions removed, the conductive layer 1002, the barrier layer 902, and the insulation layer 802 can have coplanar surfaces.

An endpoint (EP) of the barrier planarizing phase can be determined with detection systems, such as a real time profile control (RTPC) system, a thickness monitor system, or an optical endpoint system. For example, the endpoint of the barrier planarizing phase can be detected to indicate a remaining profile or thickness of the conductive layer 1002 or the barrier layer 902 so that the planarization process can adjust pressures or parameters to remove the remaining profile.

The barrier planarizing phase can include a planarization process that uses a multi-platen or multi-station planarization system (not shown). For example, the barrier planarizing phase can include a first platen (P1) or station of the planarization system having a three-platen configuration.

Figure 12:
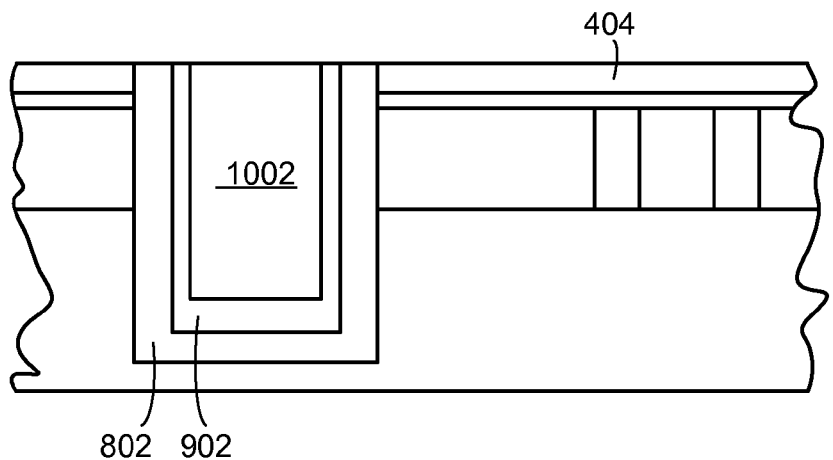
FIG. 12 is the structure of FIG. 11 in a mask planarizing phase.

Referring now to FIG. 12, therein is shown the structure of FIG. 11 in a mask planarizing phase. The conductive layer 1002, the barrier layer 902, and the insulation layer 802 can be partially removed with the planarization process.

Portions of the conductive layer 1002, the barrier layer 902, and the insulation layer 802 that are over the hard mask 408 of FIG. 4 can be removed. The portions can be removed with a high down force, more specifically a force larger than approximately 2 pounds per square inch (psi). For example, the high down force can be used in a chemical mechanical planarization (CMP).

After the portions are removed and the hard mask 408 is detected, a soft landing or touchdown technique can be used. In other words, the hard mask 408 and portions of the conductive layer 1002, the barrier layer 902, and the insulation layer 802 that are over the buffer layer 404 can be removed with a low down force, more specifically a force less than approximately 2 pounds per square inch (psi), using the planarization process.

The insulation layer 802, the hard mask 408, and the portions can be removed using a high selectivity slurry to the conductive layer 1002 to reduce or eliminate dishing of the conductive layer 1002. The high selectivity slurry to the conductive layer 1002 is defined as a fluid medium (or a chemical solution including abrasive particles, oxidants, etchants, corrosion inhibitors, or a combination thereof) that has a high removal ratio, which is more than approximately 20, of a removal rate of the insulation layer 802 and the hard mask 408 to that of the conductive layer 1002, thereby reducing dishing of the conductive layer 1002.

Dishing is defined as a characteristic of a surface that is dish-like, concave, or inwardly curved. For example, dishing can occur or can be induced in the barrier planarizing phase (e.g. with the first platen or P1) that uses the high down force.

Dishing can be reduced or eliminated on a surface of the conductive layer 1002 with the low down force and the high selectivity slurry to the conductive layer 1002. For example, with a lower polishing pressure (compared to that of the high down force), the low down force removes the conductive layer 1002 at a slow removal rate, thereby reducing or preventing dishing.

An endpoint (EP) of the mask planarizing phase can be determined with a detection system. For example, the detection system can include a thickness monitor system. The hard mask 408 can be used not only for the planarization process but also for an endpoint detection purpose.

For example, the endpoint detection purpose can be used for a chemical-mechanical planarization (CMP). Also for example, the hard mask 408 can be a polish stop layer or function as an endpoint indicator.

As an example, the endpoint of the mask planarizing phase can be detected to indicate a remaining profile or thickness of the insulation layer 802 or the hard mask 408 so that the planarization process can adjust pressures or parameters to remove the remaining profile.

The mask planarizing phase can include the planarization process that uses the planarization system. For example, the mask planarizing phase can include a second platen (P2) of the planarization system.

Figure 13:
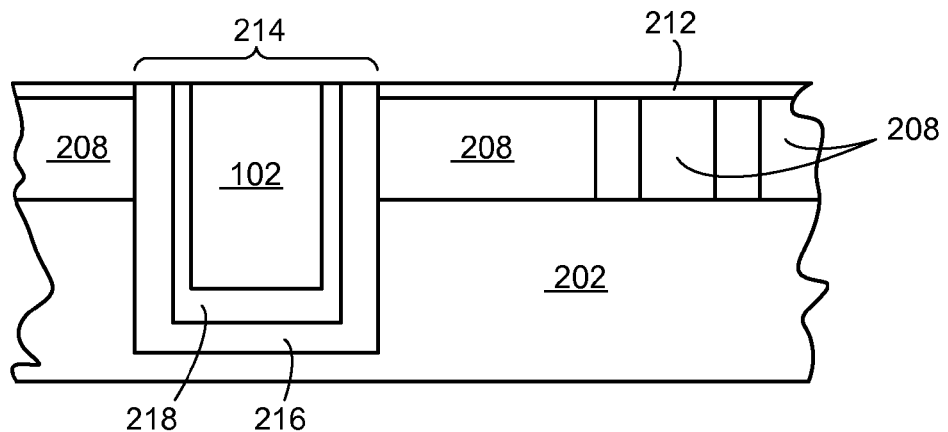
FIG. 13 is the structure of FIG. 12 in a buffer planarizing phase.

Referring now to FIG. 13, therein is shown the structure of FIG. 12 in a buffer planarizing phase. The buffer layer 404 of FIG. 4 and portions of the conductive layer 1002 of FIG. 10, the barrier layer 902 of FIG. 9, and the insulation layer 802 of FIG. 8 that are over the etch stop layer 212 can be removed with the planarization process.

The through silicon via 102, the liner 218, and the insulator 216 can be exposed with the portions of the conductive layer 1002, the barrier layer 902, and the insulation layer 802 removed, respectively. The through silicon via 102, the liner 218, and the insulator 216 can be within the recess 214, extending through the etch stop layer 212, the interlayer dielectric 208, and a portion of the bulk substrate 202.

The buffer layer 404 and the portions can be removed with a low down force, more specifically a force less than approximately 2 pounds per square inch (psi). For example, the low down force can be used in a chemical-mechanical planarization (CMP). With the buffer layer 404 and the portions removed, the through silicon via 102, the liner 218, the insulator 216, and the etch stop layer 212 can be planar.

The buffer layer 404 and the portions can be removed using a high selectivity slurry to the etch stop layer 212. The high selectivity slurry to the etch stop layer 212 is defined as a fluid medium (or a chemical solution including abrasive particles, oxidants, etchants, corrosion inhibitors, or a combination thereof) that has a high removal ratio of a removal rate of the buffer layer 404 to that of the etch stop layer 212. The high selectivity slurry has more specifically the high removal ratio of the buffer layer 404 over the etch stop layer 212 larger than approximately 100.

An endpoint (EP) of the buffer planarizing phase can be determined with a detection system. For example, the detection system can include fixed time or endpoint detection. As an example, the endpoint of the buffer planarizing phase can be detected to indicate a remaining profile or thickness of the buffer layer 404 so that the planarization process can adjust pressures or parameters to remove the remaining profile.

With the high selectivity slurry to the etch stop layer 212 and a better thickness control using the detection of the endpoint, a self-stop mechanism is achieved. With the self-stop mechanism, the planarization process can stop the removal process of the buffer layer 404 after the buffer layer 404 is removed without requiring additional processing steps, exposing the etch stop layer 212.

The buffer planarizing phase can include the planarization process that uses the planarization system. For example, the buffer planarizing phase can include a third platen (P3) of the planarization system.

After the buffer planarizing phase is completed, the through silicon via 102, the liner 218, the insulator 216, and the etch stop layer 212 can have surfaces having characteristics of being formed with the hard mask 408 detected and the buffer layer 404 removed with the low down force and the high selectivity slurry to the conductive layer 1002 and the etch stop layer 212. The characteristics of being formed with the hard mask 408 detected and the buffer layer 404 removed can include physical features. For example, the physical features can include approximately uniform surface planarity, free of delamination, free of dishing, free of erosion, polishing marks, or any other removal marks.

Figure 14:
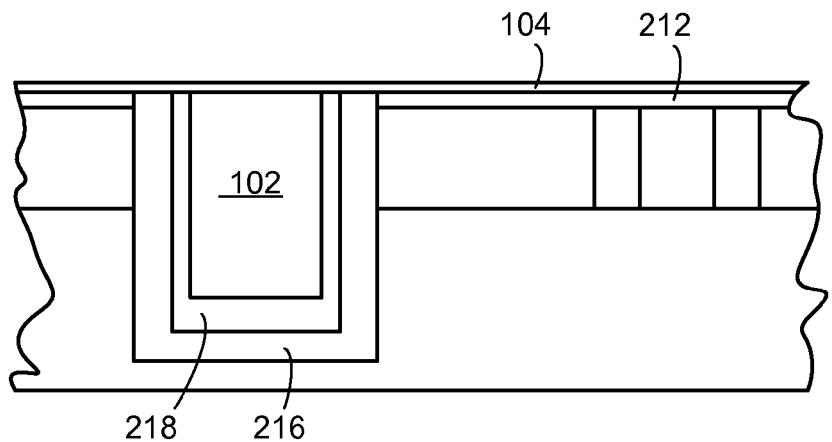
FIG. 14 is the structure of FIG. 13 in a cap forming phase.

Referring now to FIG. 14, therein is shown the structure of FIG. 13 in a cap forming phase. The passivation layer 104 can be deposited over the through silicon via 102, the liner 218, the insulator 216, and the etch stop layer 212.

The passivation layer 104 can be formed directly on the through silicon via 102 and the etch stop layer 212. The passivation layer 104 can protect the through silicon via 102.

For example, the passivation layer 104 can be a capping layer or a protective barrier layer. Also for example, the passivation layer 104 can include NBloK, which can be a compound with a combination of silicon (Si), carbon (C), nitrogen (N), and hydrogen (H).

It has been discovered that the integrated circuit system 100 provides improved manufacturability. The portions of the conductive layer 1002, the barrier layer 902, and the insulation layer 802 that are over the hard mask 408 are removed in the process of forming the through silicon via 102, the liner 218, and the insulator 216, respectively. The portions are removed with the high down force in the barrier planarizing and mask planarizing phases, thereby resulting in high removal rate, increased throughput, increased productivity, and thus the improved manufacturability.

It has also been discovered that the integrated circuit system 100 provides an improved topography of the through silicon via 102. After the portions of the conductive layer 1002, the barrier layer 902, and the insulation layer 802 over the hard mask 408 are removed and the hard mask 408 is detected, the soft landing technique is used such that that the hard mask 408 and the portions over the buffer layer 404 are removed with the low down force. The soft landing technique enables an effective thickness control with a reliable and robust endpoint detection on the hard mask 408 and an effective planarization of the buffer layer 404, thereby improving the topography.

It has further been discovered that the integrated circuit system 100 provides improved reliability. The portions of the conductive layer 1002, the barrier layer 902, and the insulation layer 802 that are over the etch stop layer 212 are removed in the process of forming the through silicon via 102, the liner 218, and the insulator 216, respectively. The portions are removed with the high selectivity slurry to the etch stop layer 212. The self-stop mechanism is achieved with the high selectivity slurry to the etch stop layer 212, thereby resulting in the improved reliability.

Further to the discovery, the integrated circuit system 100 also provides the improved reliability with the high selectivity slurry to the conductive layer 1002. The high selectivity slurry to the conductive layer 1002 reduces or eliminates dishing of the conductive layer 1002 in the mask planarizing phase, thereby also improving the reliability.

Yet further to the discovery, the integrated circuit system 100 further provides the improved reliability with the etch stop layer 212. The etch stop layer 212 protects and thus prevents impact to the contact 210. With the etch stop layer 212, the through silicon via 102 and the contact 210 are not concurrently exposed during the planarization process, thereby further improving the reliability.

Yet further to the discovery, the integrated circuit system 100 yet further provides the improved reliability with the soft landing technique. The soft landing technique enables the planarization process to use the low down force in the mask planarizing phase. The low down force is used to remove the hard mask 408 and the portions of the conductive layer 1002, the barrier layer 902, and the insulation layer 802 that are over the buffer layer 404, thereby eliminating low-k delamination problems and thus improving the reliability.

Figure 15:
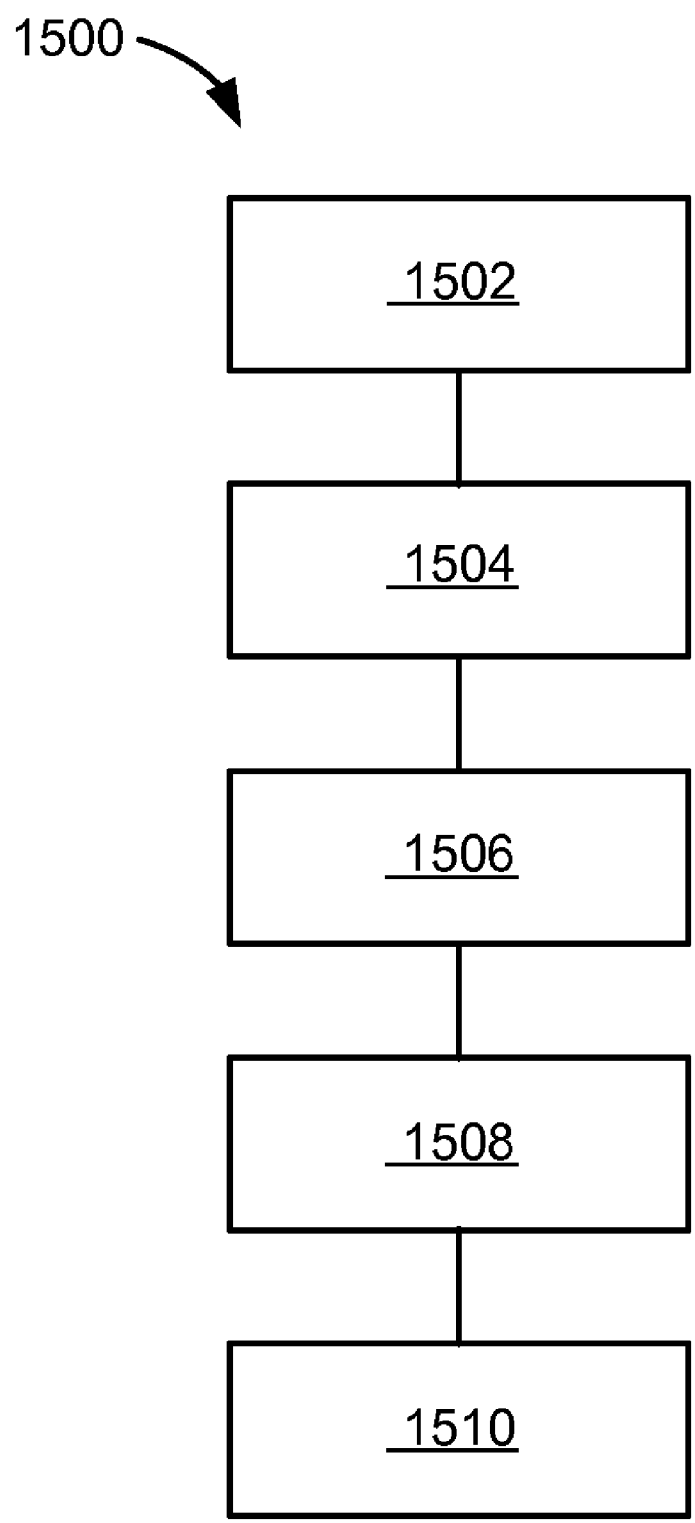
FIG. 15 is a flow chart of a method of manufacture of the integrated circuit system in a further embodiment of the present invention.

Referring now to FIG. 15, therein is shown a flow chart of a method 1500 of manufacture of the integrated circuit system 100 in a further embodiment of the present invention. The method 1500 includes: forming an etch stop layer over a bulk substrate in a block 1502; forming a buffer layer on the etch stop layer in a block 1504; forming a hard mask on the buffer layer in a block 1506; forming a through silicon via through the etch stop layer with the hard mask detected and the buffer layer removed with a low down force in a block 1508; and forming a passivation layer on the through silicon via and the etch stop layer in a block 1510.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit system comprising:
   providing a bulk substrate;
   forming an interlayer dielectric directly on the bulk substrate;
   forming a contact of a first conductive material in the interlayer dielectric;
   forming an etch stop layer over the bulk substrate;
   forming a buffer layer on the etch stop layer;
   forming a hard mask on the buffer layer;
   forming a recess through the etch stop layer;
   forming an insulator in the recess and over the etch stop layer;
   forming a barrier layer over the insulator;
   depositing a second conductive material different from the first conductive material of the contact over the barrier layer;
   applying a first planarization force to remove portions of the first conductive material, the barrier layer, and the insulator until the hard mask is reached;
   applying a second planarization force to remove the hard mask and the buffer layer such that a top surface of the etch stop layer is coplanar with top surfaces of the insulator, the liner, and the second conductive material; and
   forming a passivation layer directly on the top surfaces of the second conductive material and the etch stop layer, the second conductive material and the etch stop layer having uniform surface planarity.

2. The method as claimed in claim 1 wherein forming the through silicon via includes forming the through silicon via coplanar with the etch stop layer.

3. The method as claimed in claim 1 wherein forming the through silicon via includes forming the through silicon via in the bulk substrate.

4. The method as claimed in claim 1 further comprising:
   forming a conductive layer over the etch stop layer; and
   wherein:

forming the through silicon via includes removing a portion of the conductive layer with a high down force.

5. The method as claimed in claim 1 further comprising:
forming a conductive layer over the buffer layer; and wherein:
forming the through silicon via includes removing a portion of the conductive layer with the low down force.

6. A method of manufacture of an integrated circuit system comprising:
providing a bulk substrate;
forming an interlayer dielectric directly on the bulk substrate having an active side;
forming a contact of a first conductive material in the interlayer dielectric;
forming an etch stop layer over the bulk substrate;
forming a buffer layer on the etch stop layer;
forming a hard mask on the buffer layer;
forming a recess through the etch stop layer;
forming an insulator in the recess and over the etch stop layer;
forming a barrier layer over the insulator;
depositing a second conductive material different from the first conductive material of the contact over the barrier layer;
applying a first planarization force to remove portions of the first conductive material, the barrier layer, and the insulator until the hard mask is reached;
applying a second planarization force to remove the hard mask and the buffer layer such that a top surface of the etch stop layer is coplanar with top surfaces of the insulator, the liner, and the second conductive material; and
forming a passivation layer directly on the top surfaces of the second conductive material through silicon via and the etch stop layer, the second conductive material through silicon via and the etch stop layer having uniform surface planarity.

7. The method as claimed in claim 6 wherein forming the etch stop layer over the interlayer dielectric.

8. The method as claimed in claim 6 wherein forming the through silicon via includes removing a portion of the conductive layer with a high selectivity slurry to the etch stop layer, the high selectivity slurry having a high removal ratio of the buffer layer to the etch stop layer.

9. The method as claimed in claim 6 wherein:
depositing the second conductive material includes depositing copper; and
forming the contact of the first conductive material includes forming the contact of tungsten.

10. The method as claimed in claim 6 wherein forming the through silicon via includes forming the through silicon via within the recess.

11. An integrated circuit system comprising:
a bulk substrate having a recess;
an interlayer dielectric directly on the bulk substrate;
a contact formed from a first conductive material in the interlayer dielectric;
an etch stop layer over the bulk substrate;
an insulator formed in the recess;
a liner over the insulator;
a through silicon via formed from a second conductive material different from the first conductive material of the contact, positioned through the etch stop layer, a top surface of the etch stop layer that is coplanar with top surfaces of the insulator, the liner, and the through silicon via; and
a passivation layer directly on the top surfaces of the through silicon via and the etch stop layer.

12. The system as claimed in claim 11 wherein the through silicon via is coplanar with the etch stop layer.

13. The system as claimed in claim 11 wherein the through silicon via is in the bulk substrate.

14. The system as claimed in claim 11 wherein:
the liner is within the recess; and
the through silicon via is over the liner.

15. The system as claimed in claim 11 wherein the through silicon via is free of dishing.

16. The system as claimed in claim 11 wherein the bulk substrate has an active side.

17. The system as claimed in claim 16 wherein the etch stop layer is over the interlayer dielectric.

18. The system as claimed in claim 16 wherein the through silicon via has polishing marks characteristic of being formed with the buffer layer removed with a high selectivity slurry to the etch stop layer, the high selectivity slurry having a high removal ratio of the buffer layer to the etch stop layer.

19. The system as claimed in claim 16 wherein the second conductive material is copper and the first conductive material is tungsten.

20. The system as claimed in claim 16 wherein the through silicon via is within the recess.

* * * * *